United States Patent [19]
Park et al.

[11] Patent Number: 6,144,060
[45] Date of Patent: Nov. 7, 2000

[54] INTEGRATED CIRCUIT DEVICES HAVING BUFFER LAYERS THEREIN WHICH CONTAIN METAL OXIDE STABILIZED BY HEAT TREATMENT UNDER LOW TEMPERATURE

[75] Inventors: In-seon Park, Seoul; Yeong-kwan Kim; Sang-in Lee, both of Kyungki-do; Byung-hee Kim, Seoul; Sang-min Lee; Chang-soo Park, both of Kyungki-do, all of Rep. of Korea

[73] Assignee: Samsung Electronics Co., Ltd., Rep. of Korea

[21] Appl. No.: 09/127,353

[22] Filed: Jul. 31, 1998

[30] Foreign Application Priority Data

Jul. 31, 1997 [KR] Rep. of Korea ................ 97-36558

[51] Int. Cl.[7] .................................................. H01L 29/72
[52] U.S. Cl. ..................... 257/310; 257/298; 257/303; 257/306; 257/310; 257/532
[58] Field of Search .................................. 257/296, 298, 257/303, 306, 310, 532

[56] References Cited

U.S. PATENT DOCUMENTS

| | | | |
|---|---|---|---|
| 5,212,620 | 5/1993 | Evans et al. | 257/432 |
| 5,330,931 | 7/1994 | Emesh et al. | 438/120 |
| 5,350,705 | 9/1994 | Brassington et al. | 257/295 |
| 5,426,075 | 6/1995 | Perino et al. | 437/235 |
| 5,434,742 | 7/1995 | Saito et al. | 361/321.5 |
| 5,438,023 | 8/1995 | Argos, Jr. et al. | 437/235 |
| 5,452,178 | 9/1995 | Emesh et al. | 361/303 |
| 5,639,316 | 6/1997 | Cabral, Jr. et al. | 148/277 |

OTHER PUBLICATIONS

Onishi et al, IEDM 94–843, Jan. 1994.

*Primary Examiner*—Edward Wojciechowicz
*Attorney, Agent, or Firm*—Myers Bigel Sibley & Sajovec

[57] ABSTRACT

Integrated circuit devices include a first dielectric layer, an electrically insulating layer on the first dielectric layer and an an aluminum oxide buffer layer formed by atomic layer deposition (ALD) and stabilized by heat treatment at a temperature of less than about 600° C., between the first dielectric layer and the electrically insulating layer. The first dielectric layer may comprise a high dielectric material such as a ferroelectric or paraelectric material. The electrically insulating layer may also comprise a material selected from the group consisting of silicon dioxide, borophosphosilicate glass (BPSG) and phosphosilicate glass (PSG). To provide a preferred integrated circuit capacitor, a substrate may be provided and an interlayer dielectric layer may be provided on the substrate. Here, a metal layer may also be provided between the interlayer dielectric layer and the first dielectric layer. The metal layer may comprise a material selected from the group consisting of Pt, Ru, Ir, and Pd.

17 Claims, 14 Drawing Sheets

INTEGRATED CIRCUIT DEVICES HAVING BUFFER LAYERS THEREIN WHICH CONTAIN METAL OXIDE STABILIZED BY HEAT TREATMENT UNDER LOW TEMPERATURE

FIELD OF THE INVENTION

The present invention relates to integrated circuit devices and methods of forming same, and more particularly to integrated circuit devices containing stabilized buffer layers and methods of forming same.

BACKGROUND OF THE INVENTION

In general, data can be stored as charge in a cell capacitor of a DRAM device and the stored charge can be lost in various ways. Accordingly, a refresh operation for periodically restoring information is typically required. The refresh time interval, which is the interval between consecutive refresh operations, can be enhanced by increasing the capacitance of the cell capacitor so that a larger amount of charge (Q) can be stored therein.

One method for increasing the capacitance of a cell capacitor is to use a ferroelectric material having a high dielectric coefficient as a dielectric layer of a capacitor. An interlayer dielectric layer is then formed on the entire surface of the capacitor including the ferroelectric material as the dielectric layer. The interlayer dielectric layer may comprise silicon dioxide. However, silicon dioxide may chemically react with the ferroelectric material and cause a deterioration in the characteristics of the capacitor. The reaction may also generate cracks in the silicon dioxide layer.

A method for preventing the above-described problems by preventing diffusion of the ferroelectric material and penetration of hydrogen into the ferroelectric material is disclosed in U.S. Pat. No. 5,212,620. In the '620 patent, a $TiO_2$ layer is provided as a buffer layer between the ferroelectric material and the silicon dioxide interlayer dielectric layer. According to the '620 patent, a titanium (Ti) layer is formed and then treated at 650° C. under an oxygen atmosphere, to thereby form a $TiO_2$ layer. At this time, if the heat treatment is carried out at 650° C. or less, the Ti layer may be incompletely oxidized to TiO or $TiO_x$. The incompletely oxidized buffer layer may also have a low resistivity, and this may lead to an increase in leakage current between upper and lower electrodes of the capacitor. Also, a $TiO_2$ layer formed by sputtering typically has low step coverage. However, in order to provide sufficiently small contact resistance between a contact plug and the lower electrode of the capacitor, any back-end processing steps typically must be performed at 650° C. or lower. For example, if a subsequent process step is performed at 650° C. or more, a barrier metal layer (for preventing diffusion of a lower electrode material into the contact plug) may be adversely affected and may not be able to function satisfactorily as a diffusion barrier layer. Accordingly, the use of $TiO_2$ buffer layers may be inappropriate in processes which require low temperatures on the order of 650° C. or less.

SUMMARY OF THE INVENTION

It is therefore an object of the present invention to provide improved integrated circuit devices and methods of forming same.

It is another object of the present invention to provide improved integrated circuit capacitors having high dielectric layers therein and methods of forming same.

It is still another object of the present invention to provide integrated circuit capacitors having improved electrical characteristics and methods of forming same.

These and other objects, advantages and features of the present invention are provided by integrated circuit devices (e.g., capacitors) which comprise a first dielectric layer, an electrically insulating layer on the first dielectric layer and an aluminum oxide buffer layer formed by atomic layer deposition (ALD) and stabilized by heat treatment at a temperature of less than about 600° C., between the first dielectric layer and the electrically insulating layer. The first dielectric layer may comprise a high dielectric material such as a ferroelectric or paraelectric material. In particular, the first dielectric layer may comprise a material selected from the group consisting of PZT, $BaTiO_3$, $PbTiO_3$, STO and BST. The electrically insulating layer may also comprise a material selected from the group consisting of silicon dioxide, borophosphosilicate glass (BPSG) and phosphosilicate glass (PSG). In addition, to provide a preferred integrated circuit capacitor a substrate may be provided and an interlayer insulating layer may be provided on the substrate. Here, a metal layer may also be provided between the interlayer insulating layer and the first dielectric layer. The metal layer may comprise a material selected from the group consisting of Pt, Ru, Ir, and Pd.

According to another embodiment of the present invention, an integrated circuit capacitor may be provided having a first electrically insulating layer, a first metal layer pattern on the first electrically insulating layer, a first dielectric layer on the first metal layer pattern, opposite the first electrically insulating layer, and a second metal layer pattern on the first dielectric layer, opposite said first metal layer pattern. According to a preferred aspect of this embodiment, a buffer layer may also be provided. This buffer layer may comprise a metal oxide layer stabilized by heat treatment at a temperature of less than about 600° C. This buffer layer may also be provided on sidewalls of the first metal layer pattern, the first dielectric layer and the second metal layer pattern. The metal oxide layer may also have a thickness in a range between about 40 Å and 300 Å. A barrier layer may also be provided between the first electrically insulating layer and the first metal layer pattern. The barrier layer preferably comprises a metal selected from the group consisting of TiN, TiSiN, TaN, TaSiN, TiAlN, TaAlN and $RuO_2$.

According to still another embodiment of the present invention, preferred methods of forming integrated circuit capacitors are provided which include the steps of forming a pattern (including a high dielectric material), on a semiconductor substrate and then forming a metal oxide layer stabilized by heat treatment at a temperature of 600° C. or less, on the pattern. An electrically insulating layer is then formed on the metal oxide layer. Here, the step of forming the pattern may comprise the steps of forming a first conductive layer pattern on the semiconductor substrate, forming a high dielectric layer pattern on the first conductive layer pattern and then forming a second conductive layer pattern on the high dielectric layer pattern, opposite the first conductive layer pattern. The step of forming the pattern may also be preceded by the steps of forming an interlayer insulating layer having a contact hole therein on the semiconductor substrate and then forming a contact plug in the control hole. A barrier layer comprising aluminum oxide is then formed on the contact plug. According to a preferred aspect of this embodiment of the present invention, the step of forming the metal oxide layer comprises depositing a metal oxide layer by atomic layer deposition, at a temperature in a range between about 250° C. and 450° C. The step of forming the barrier layer may also comprise forming a barrier layer as a composite of aluminum oxide and a metal selected from the group consisting of TiN, TiSiN, TaN, TaSiN, TiAlN, TaAlN and $RuO_2$. The step of forming the metal oxide layer may also comprise thermally stabilizing the metal oxide layer while exposing the metal oxide layer to an oxygen ambient. As determined by the inventors herein, the barrier layer functions effectively even when it is thin, and the barrier layer formed by the atomic layer deposition method has excellent uniformity and step coverage. Therefore, when the barrier layer is used between the insulating layer and a capacitor including the high dielectric layer, the polarization and leakage current characteristics of the capacitor are enhanced.

DESCRIPTION OF PREFERRED EMBODIMENTS

Figure 1:
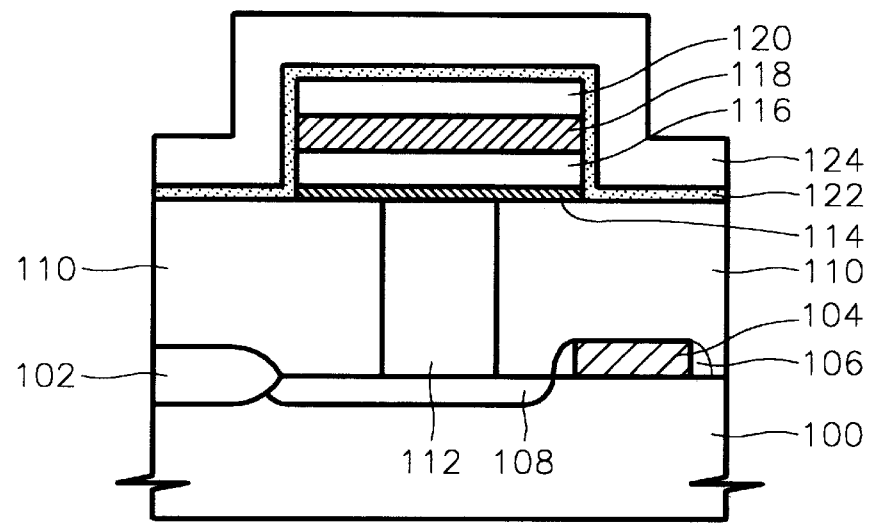
FIG. 1 is a cross-sectional view of an integrated circuit device according to a first embodiment of the present invention.

The present invention will now be described in greater detail with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The high dielectric layers described in the following embodiments encompass ferroelectric layers having high dielectric constants or paraelectric layers having high dielectric constants. Like numbers refer to like elements throughout.

FIG. 1 is a cross-sectional view of an integrated circuit device according to a first embodiment of the present invention. According to the first embodiment, a metal oxide layer stabilized by heat treatment at low temperature of 600° C. or less (i.e., an aluminum oxide layer) is formed as a buffer layer to inhibit reaction between a capacitor and an interlayer dielectric layer and enhance the polarization characteristics of the capacitor and reduce leakage current. Referring to FIG. 1, an isolation region 102 is formed on a predetermined portion of a semiconductor substrate 100 to define an active region. A transistor including a gate electrode 104, a sidewall spacer 106 and an impurity region 108, is formed on the active region, as illustrated. An interlayer insulating layer 110 for insulating and planarizing a transistor is stacked on the substrate where the transistor is formed. A contact hole which is formed in the interlayer insulating layer 110 and exposes the impurity region 108, is filled with a polysilicon contact plug 112. A barrier layer pattern 114, a lower electrode 116, a ferroelectric layer pattern 118 and an upper electrode 120 are sequentially formed as a capacitor on the interlayer insulating layer 110.

The barrier layer pattern 114 inhibits out-diffusion of dopants from the contact plug 112 and also inhibits reaction between the contact plug 112 and the lower electrode 116. Preferably, the barrier layer pattern 114 can be formed of a material such as TiN, TiSiN, TaN, TaSiN, TiAlN, TaAlN or $RuO_2$. The barrier layer pattern 114 may also be formed of a composite double layer comprising an aluminum oxide layer of 10 Å or less (having excellent barrier characteristics even as a thin layer) and a TiN, TiSiN, TaN, TaSiN, TiAlN, TaAlN or $RuO_2$ layer.

The lower electrode 116 and the upper electrode 120 are preferably formed of an oxidation-resistant metal material such as Pt, Ru, Ir, or Pd. The ferroelectric layer pattern 118 is formed of $Pb(Zr_{1-x}Ti_x)O_3$(PZT), $BaTiO_3$, $PbTiO_3$, $SrTiO_3$ (STO) or $(Ba, Sr)TiO_3$(BST) for example. A buffer layer 122 is then formed on the entire surface of the completed capacitor, and an insulating layer 124 is formed on the second buffer layer 122. It is preferable that the buffer layer 122 be formed of a metal oxide layer stabilized by heat treatment at a low temperature of 600° C. or less. Preferably, an aluminum oxide layer can be used as the metal oxide layer. Here the thickness of the aluminum oxide layer is set at 40 Å–300 Å, and preferably 80 Å–200 Å. Also, the aluminum oxide layer is deposited at 250 Å–450° C., preferably, 350° C. The aluminum oxide layer has enhanced uniformity and step coverage if it is deposited using an atomic layer deposition (ALD) technique. The deposited aluminum oxide layer is then thermally treated at a temperature in a range between about 350° C. and 600° C., under an oxygen atmosphere to stabilize the aluminum oxide layer. More preferably, the thermal treatment step is performed at a temperature in a range between about 350° C. and 450° C.

Figure 2:
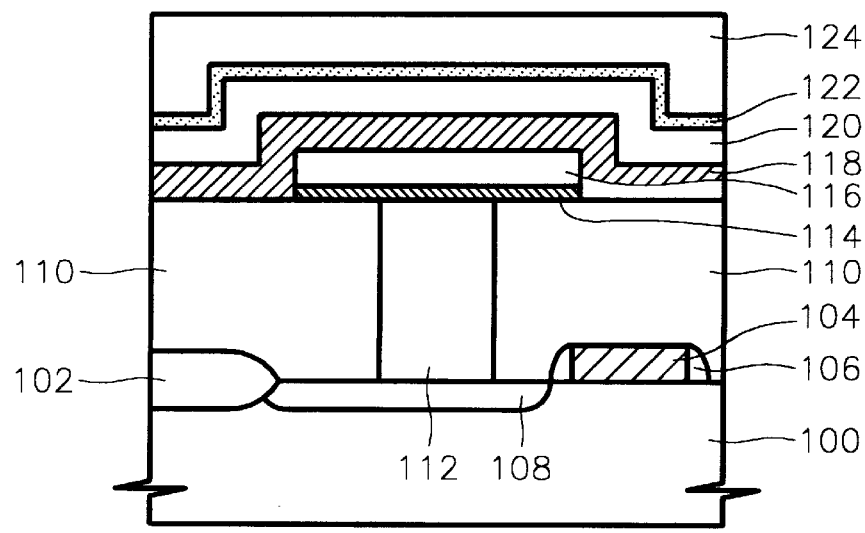
FIG. 2 is a cross-sectional view of an integrated circuit device according to a second embodiment of the present invention.

FIG. 2 is a cross-sectional view of an integrated circuit device according to a second embodiment of the present invention. In the second embodiment, unlike the first embodiment, the dielectric layer is formed as a paraelectric layer such as (Ba, Sr)TiO$_3$(BST) rather than a ferroelectric layer. Here, a paraelectric layer 118 is also formed on sidewalls of the lower electrode 116 as well as an upper surface of the lower electrode 116, as illustrated. Also, the paraelectric layer 118 may be patterned into cell block units together with the upper electrode 120 in a subsequent process to form capacitor cell units.

According to the second embodiment, the buffer layer 122 (i.e., an aluminum oxide layer) prevents chemical interaction between the capacitor and the insulating layer 124, and enhances the characteristics of the capacitor by reducing the leakage current of the capacitor. The buffer layer 122 may also inhibit oxygen diffusion to thereby reduce the likelihood that the first buffer layer 114 will become oxidized during a subsequent annealing process which is performed to enhance the dielectric constant of the paraelectric layer 118 (even if the annealing process is carried out at a temperature of 650° C. or more). As a result, the contact resistance between the lower electrode pattern 116 and the contact plug 112 does not increase.

Figure 3:
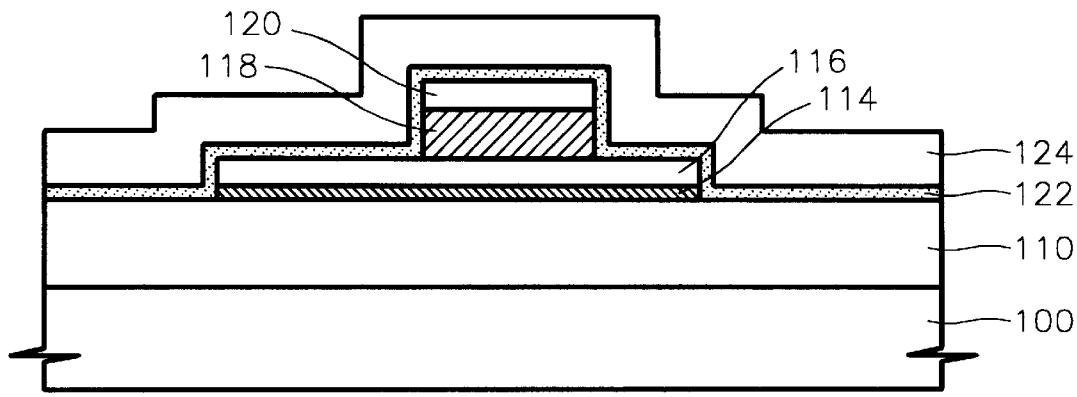
FIG. 3 is a cross-sectional view of an integrated circuit device according to a third embodiment of the present invention.

FIG. 3 is a cross-sectional view of an integrated circuit device according to a third embodiment of the present invention. In the third embodiment, a metal oxide layer which has been stabilized by heat treatment at a low temperature of 600° C. or less is employed as the buffer layer. As will be understood by those skilled in the art, the integrated circuit device of FIG. 3 has an integration density which is lower than that corresponding to the device of FIG. 1. Here, a capacitor is not formed on a contact hole, but is formed on a periphery region of the contact hole. Therefore, in the third embodiment, the barrier layer pattern 114 mainly functions as an adhesion layer to the interlayer dielectric layer 110, and the buffer layer 122 acts to prevent reaction between the capacitor and the insulating layer 124. The buffer layer 122, which is formed after the upper electrode pattern 120 is formed, may also be formed before the patterning step of the upper electrode, and in that case the buffer layer and the upper electrode are simultaneously patterned.

Figure 4:
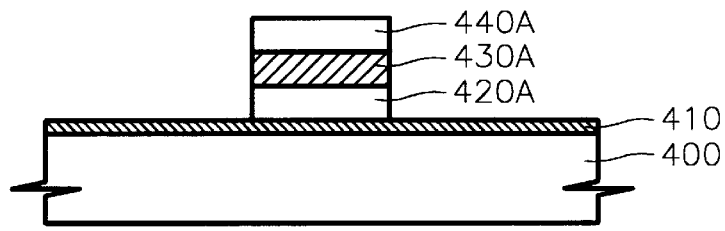
FIG. 4 is a cross-sectional view of an integrated circuit device according to a fourth embodiment of the present invention.

FIG. 4 shows a device according to a fourth embodiment of the present invention. In the fourth embodiment, a metal oxide layer (e.g., an aluminum oxide layer) is used as an insulating layer for a metal ferroelectric metal insulator silicon (MFMIS) device or a metal ferroelectric insulator silicon (MFIS) device. Referring to FIG. 4, an insulating layer 410 is formed on a semiconductor substrate 400, and an electrode is formed as a composite of a first metal layer pattern 420A, a ferroelectric layer pattern 430A and a second metal layer pattern 440A, on the insulating layer 410. It is preferable that the insulating layer 410 is formed as an aluminum oxide layer. At this time, the thickness of the aluminum oxide layer may be 10 Å~250 Å, and preferably 10 Å~100 Å. Also, the aluminum oxide layer is deposited at a temperature in a range between about 250~450° C., preferably, 350° C. According to a preferred aspect of the present invention, the aluminum oxide layer has enhanced uniformity and step coverage by forming the layer using an atomic layer deposition (ALD) technique. Also, the deposited aluminum oxide layer is heat-treated at 350~600° C., preferably, 350~450° C., in an oxygen atmosphere to stabilize the aluminum oxide layer. Even if the aluminum oxide layer 410 is formed as a thin layer, it may still possess excellent barrier characteristics. Therefore, it is still possible to prevent diffusion of silicon atoms from the semiconductor substrate 400 into the first metal layer pattern 420A.

Figure 5:
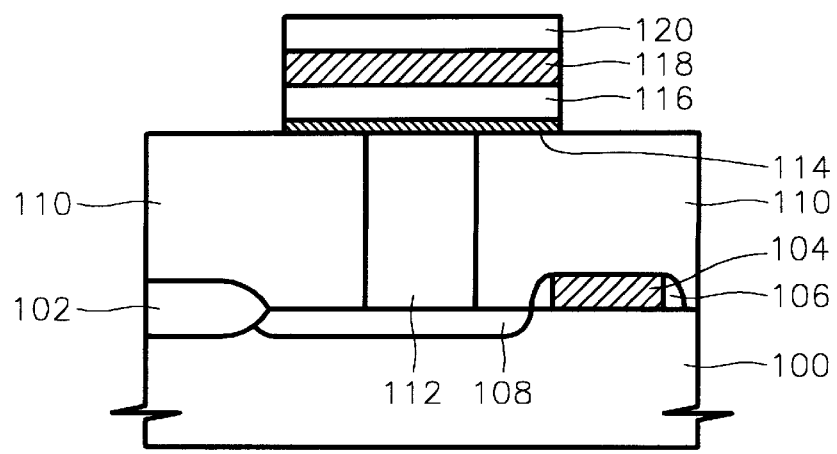
FIGS. 5–7 are cross-sectional views of intermediate structures which illustrate a method for fabricating the integrated circuit device according to the first embodiment of the present invention.
Figure 6:
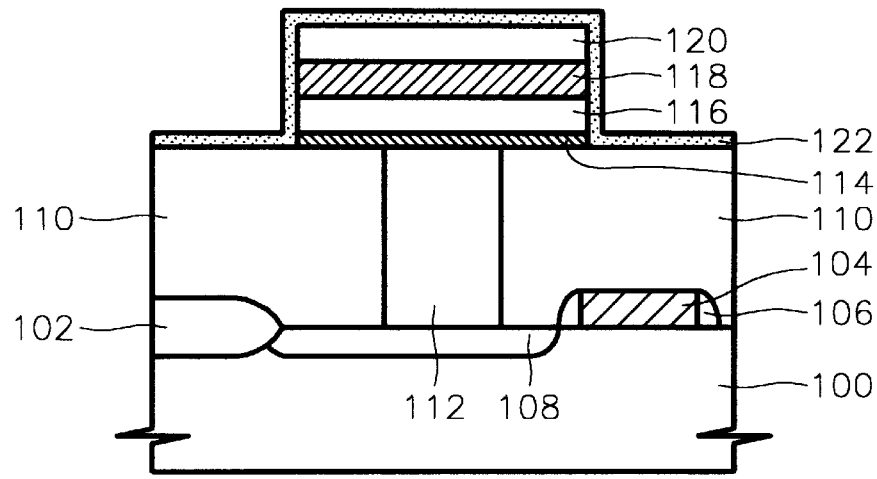
Figure 7:
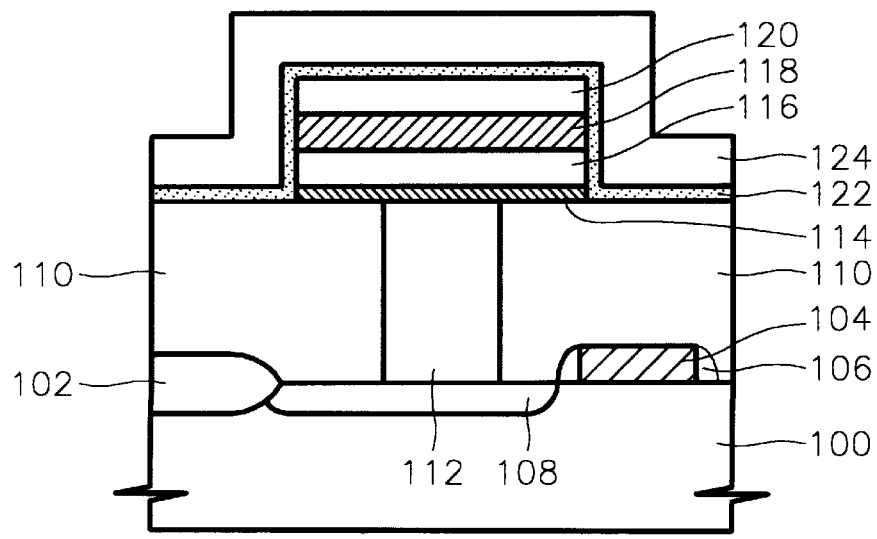

Referring now to FIGS. 5–7, preferred methods of forming an integrated circuit device according to a first embodiment of the present invention will be described. As illustrated by FIG. 5, an isolation layer 102 is formed on a semiconductor substrate 100 using a conventional LOCOS process. A gate electrode 104 of a field effect transistor and a sidewall spacer 106 are also formed on an active region in the substrate 100 which is defined by the isolation layer 102 (i.e., field oxide isolation region). Then, an impurity region 108 is formed by implanting impurity ions, using the gate electrode 104, the sidewall spacer 106, and a predetermined mask pattern (not shown) as an ion implantation mask. An interlayer insulating layer 110 is then formed on the entire surface of the substrate where the transistor is formed, to insulate and planarize the transistor. Then, the interlayer insulating layer 110 is patterned to form a contact hole which exposes the impurity region 108. Polysilicon is then deposited in the contact hole to form a contact plug 112. A barrier layer, a conductive layer for a lower electrode, a ferroelectric layer, and a conductive layer for an upper electrode are then sequentially formed and patterned to define a capacitor comprising an upper electrode pattern 120, a ferroelectric layer pattern 118, a lower electrode pattern 116 and a barrier layer pattern 114.

The barrier layer pattern 114 prevents diffusion of impurities and inhibits chemical reaction between the contact plug 112 and the lower electrode pattern 116. TiN, TiSiN, TaN, TaSiN, TiAlN, TaAlN or RuO$_2$ may be used as the barrier layer. Also, a composite layer comprising an aluminum oxide layer is possible. The lower and upper electrodes 116 and 120 may be formed of an oxidation-resistant metal such as platinum (Pt), ruthenium (Ru), iridium (Ir), or palladium (Pd). The ferroelectric layer pattern 118 is formed of a high dielectric material such as Pb(Zr$_{1-x}$Ti$_x$O$_3$ (PZT), BaTiO$_3$, PbTiO$_3$, SrTiO$_3$(STO) or (Ba, Sr)TiO$_3$(BST).

Referring to FIG. 6, a buffer layer 122 is formed on the entire surface of the resultant structure where the capacitor is formed. The buffer layer 122 is preferably formed of a metal oxide layer that has been stabilized by heat treatment at a low temperature of 600° C. or less. In particular, it is preferable that an aluminum oxide layer is used for the metal oxide layer. When the aluminum oxide layer is deposited by an atomic layer deposition (ALD) method, the uniformity and the step coverage of the layer can be enhanced. An exemplary atomic deposition method will now be described. In particular, to form an aluminum oxide layer, an aluminum source is injected into a reactor maintained at 250~450° C., and then the reactor is purged for about 1–30 seconds to deactivate it. Then an oxygen source gas is injected to react with the aluminum source and form the aluminum oxide layer. The thickness of the aluminum oxide layer is 40~300 Å. More preferably, the thickness of the aluminum oxide layer is 80~200 Å. The deposited aluminum oxide layer is then stabilized through a subsequent annealing process. During the annealing process, the aluminum oxide layer is treated at 350~600° C., and preferably at 400~500° C. Referring to FIG. 7, an insulating layer 124 is then formed on the stabilized metal oxide layer 122. The insulating layer 124 is preferably formed of an electrically insulating material such as silicon dioxide, BPSG and PSG.

According to this embodiment of the present invention, the metal oxide layer 122 formed between the capacitor (including the lower electrode 116, the ferroelectric layer pattern 118 and the upper electrode 120) and the insulating layer 124 is only stabilized at a low temperature of 600° C. or less. Therefore, this embodiment is advantageous for an integrated circuit of high integration, and the barrier layer 114 (between the contact plug 112 and the lower electrode 116) is not affected during the subsequent process of heat treatment. As a result, the electrical characteristics of the capacitor can be enhanced.

Figure 8:
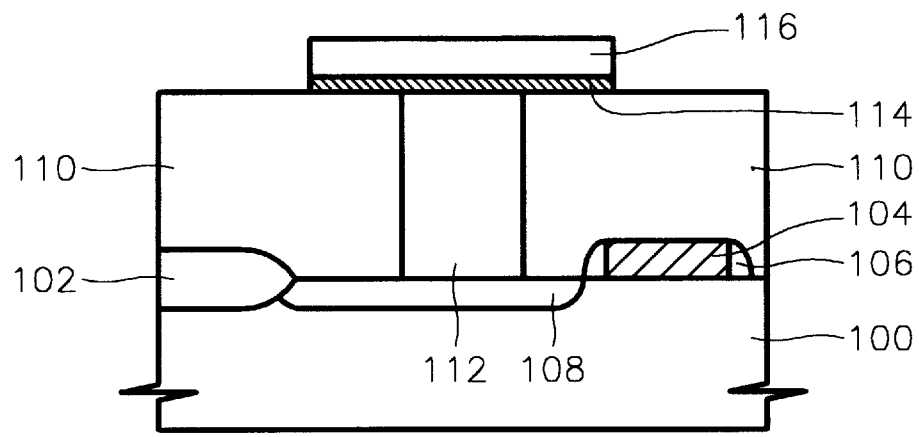
FIGS. 8–11 are cross-sectional views of intermediate structures which illustrate a method for fabricating the integrated circuit device according to the second embodiment of the present invention.
Figure 9:
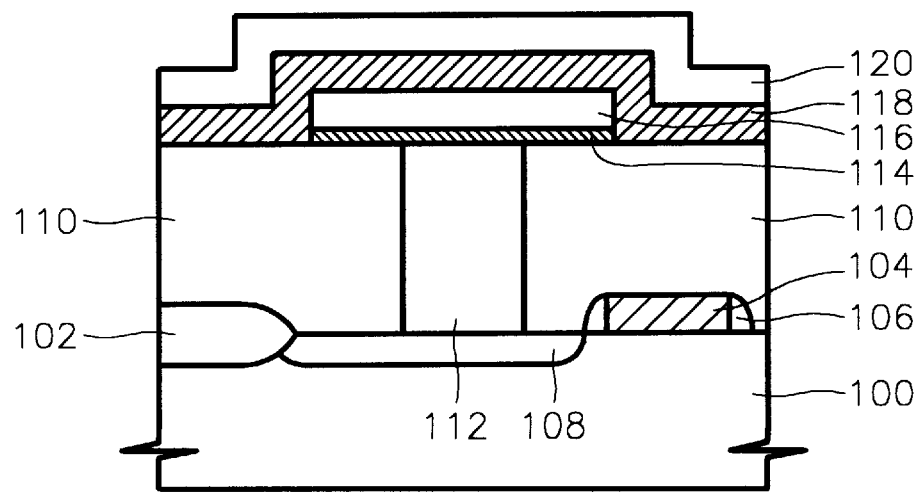
Figure 10:
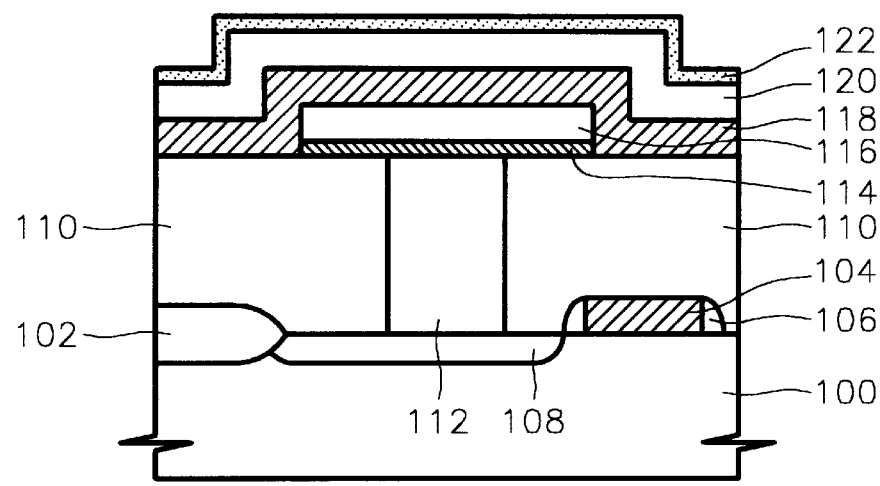
Figure 11:
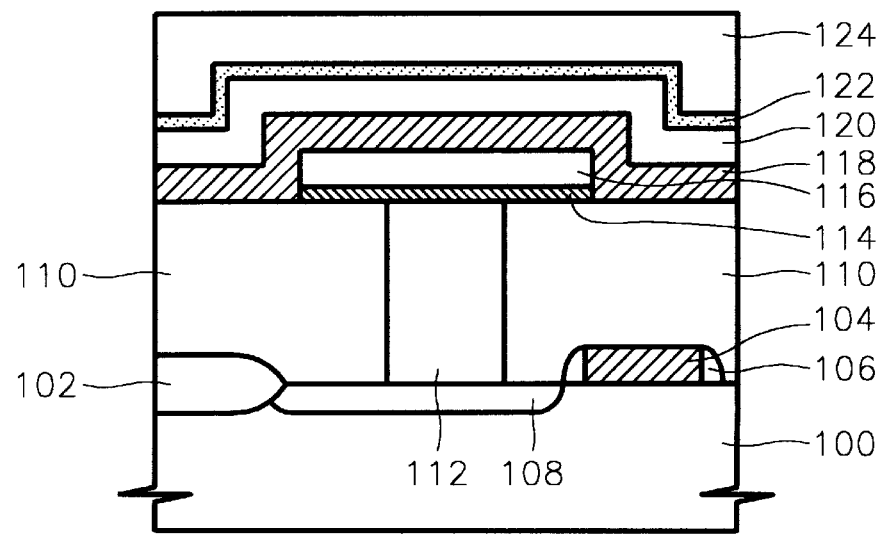

Referring now to FIGS. 8–11, preferred methods of forming an integrated circuit device according to a second embodiment of the present invention will be described. As illustrated by FIG. 8, the barrier layer pattern 114 and the lower electrode 116 are formed first. Next, a paraelectric layer 118 (e.g., a BST layer) and an upper electrode 120 are formed and then patterned to complete a capacitor, as illustrated by FIG. 9. Then, as shown in FIGS. 10–11, steps are carried out to form the buffer layer 122, anneal the buffer layer 122 and then form the insulating layer 124.

Figure 12:
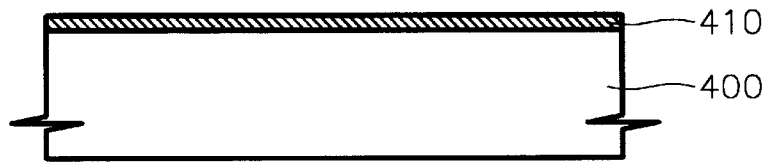
FIGS. 12–14 are cross-sectional views of intermediate structures which illustrate a method for fabricating the integrated circuit device according to the fourth embodiment of the present invention.
Figure 13:
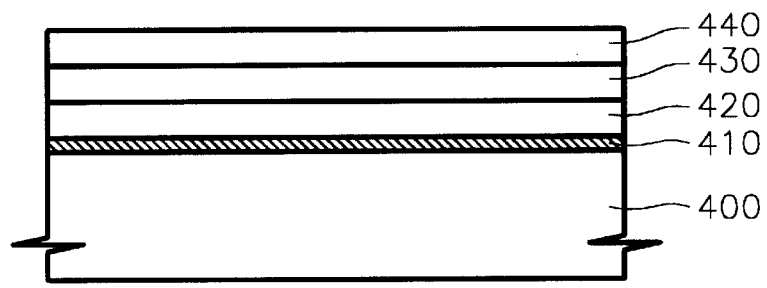
Figure 14:
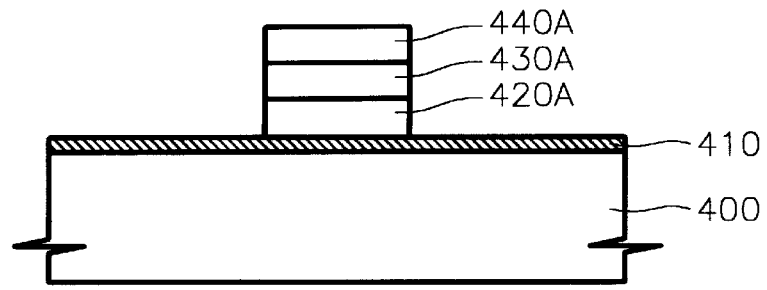

Referring now to FIGS. 12–14, preferred methods of forming an integrated circuit device according to a fourth embodiment of the present invention will be described. Referring to FIG. 12, an insulating layer 410 is formed on a semiconductor substrate 400. The insulating layer 410 is formed of a metal oxide which as been stabilized by a thermal treatment at a low temperature of 600° C. or less. The metal oxide layer may be deposited as an aluminum oxide layer by an atomic layer deposition (ALD) method to enhance the uniformity and step coverage. Here, an aluminum source is injected into a reactor maintained at 250~450° C., and then the reactor is purged for a duration of 1~30 seconds to deactivate it. Then, an oxygen source is injected into the reactor to thereby form the aluminum oxide layer. The thickness of the aluminum oxide layer is preferably 10~250 Å. The aluminum oxide layer is then heat-treated at 350~600° C., and preferably at 400~500° C., under oxygen atmosphere, to thereby complete the formation of the electrically insulating layer 410. Here, the heat treatment step may be performed under a nitrogen, ammonia, argon or vacuum atmosphere to prevent oxidization of the lower silicon substrate 400.

Referring now to FIG. 13, a first metal layer 420, a ferroelectric layer 430 and a second metal layer 440 are sequentially formed on the insulating layer 410. The first and second metal layers 420 and 440 are preferably formed of an oxidation-resistant metal material such as Pt, Ru, Ir and Pd, and the ferroelectric layer 430 is formed of $PZT(Pb(Zr_{1-x}Ti_x)O_3)$, $BaTiO_3$, $PbTiO_3$, $SrTiO_3(STO)$, or $(Ba,Sr)TiO_3(BST)$. Referring now to FIG. 14, the second metal layer 440, the ferroelectric layer 430 and the first metal layer 420 are sequentially patterned, to thereby form a top electrode 440A, the ferroelectric layer pattern 430A as a capacitor dielectric and a bottom electrode 420A.

Accordingly, as described above, a thin aluminum oxide layer 410 can be formed at a low temperature and has excellent barrier characteristics. Therefore, it is possible to prevent diffusion of silicon atoms from a semiconductor substrate into the first lower electrode 420A. Also, the thin aluminum oxide layer 410 can prevent oxidation of the semiconductor substrate 400 by preventing diffusion of oxygen into the substrate 400. Moreover, the dielectric constant of an aluminum oxide layer 410 is about 8~10, which is greater than silicon dioxide which has a dielectric constant of about 4.

The present invention will now be described in detail with reference to the following examples, however, the present invention is not limited to these examples.

Polarization Characteristics of Capacitors After Deposition of an Aluminum Oxide Layer According to a first series of examples, a titanium oxide layer as a barrier layer, a platinum layer as a lower electrode, a PZT layer as a dielectric layer, and a platinum layer as an upper electrode were deposited on a substrate. The upper electrode and the dielectric layer were patterned, and then the aluminum oxide layer was deposited under the conditions shown in Table 1 to form the structure of FIG. 2.

TABLE 1

| EXAMPLE | THICKNESS OF ALUMINUM OXIDE LAYER (Å) | DEPOSITION TEMPERATURE (°C.) | PURGE TIME(SEC) |
|---|---|---|---|
| A | 60 | 350 | 1.1 |
| B | 100 | 350 | 9.9 |
| C | 100 | 350 | 3.3 |

Figure 15A:
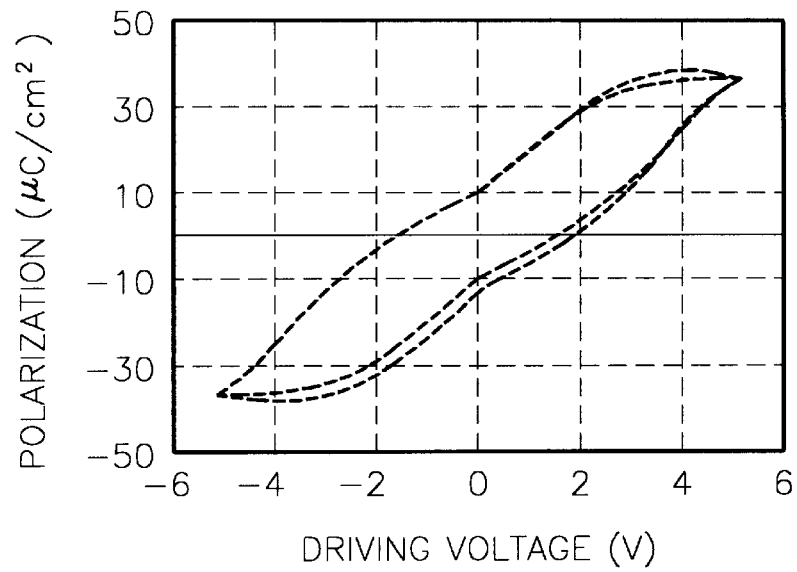
FIGS. 15A–15C are graphs showing polarization characteristics of a capacitor measured after depositing an aluminum oxide layer.
Figure 15B:
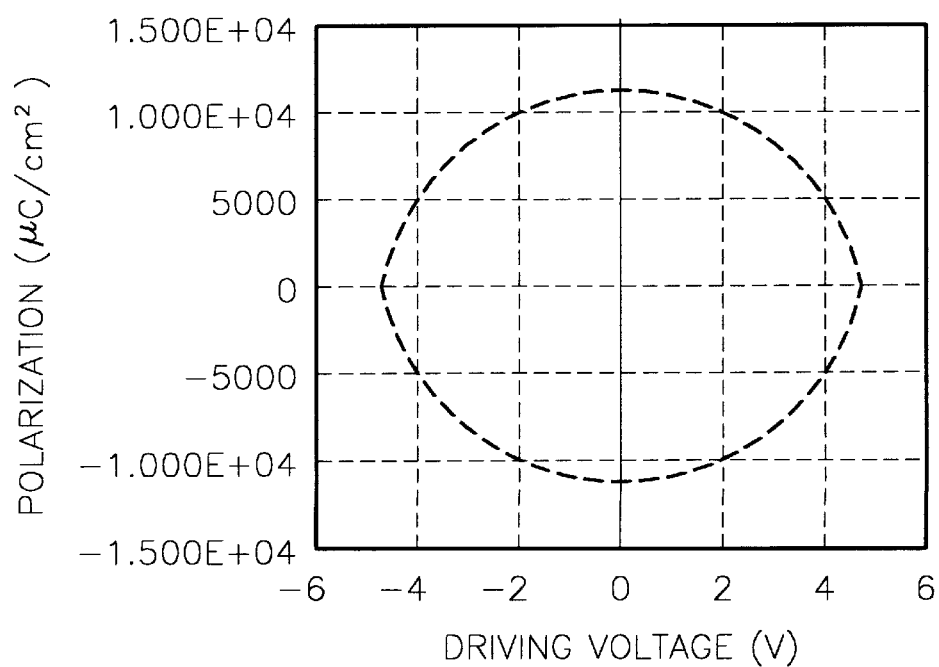
Figure 15C:
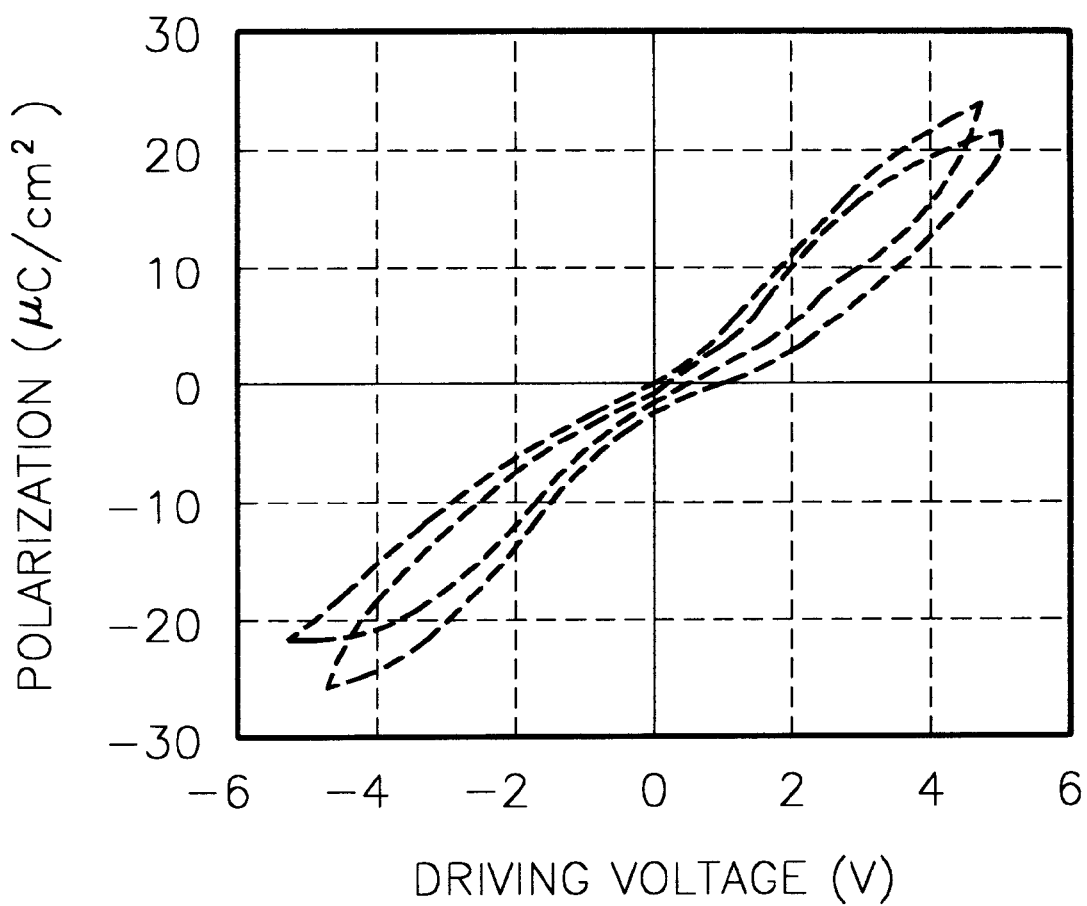

After deposition of the aluminum oxide layer, the polarization characteristics of the capacitor were measured. The results are shown in FIGS. 15A–15C. As shown in FIGS. 15A–15C, after deposition of the aluminum oxide layer, the capacitor has essentially no polarization characteristics regardless of the conditions at which the aluminum oxide layer was deposited.

Polarization Characteristics of Capacitor After Annealing the Aluminum Oxide Layer An upper electrode pattern and a ferroelectric layer pattern of the capacitor were formed in the same manner as the above-described example, and the aluminum oxide layer was deposited as shown in Table 2. An annealing step was then performed for 30 min under an atmosphere of oxygen at 450° C. The polarization characteristics of the capacitors were then measured, as illustrated by FIGS. 16A–16B.

TABLE 2

| EXAMPLE | THICKNESS OF ALUMINUM OXIDE LAYER (Å) | DEPOSITION TEMPERATURE (°C.) | PURGE TIME (SEC) | ANNEALING TEMPERATURE (°C.) | ANNEALING TIME (MIN) |
|---|---|---|---|---|---|
| A | 100 | 350 | 3.3 | 450 | 30 |
| B | 300 | 350 | 3.3 | 450 | 30 |

Figure 16A:
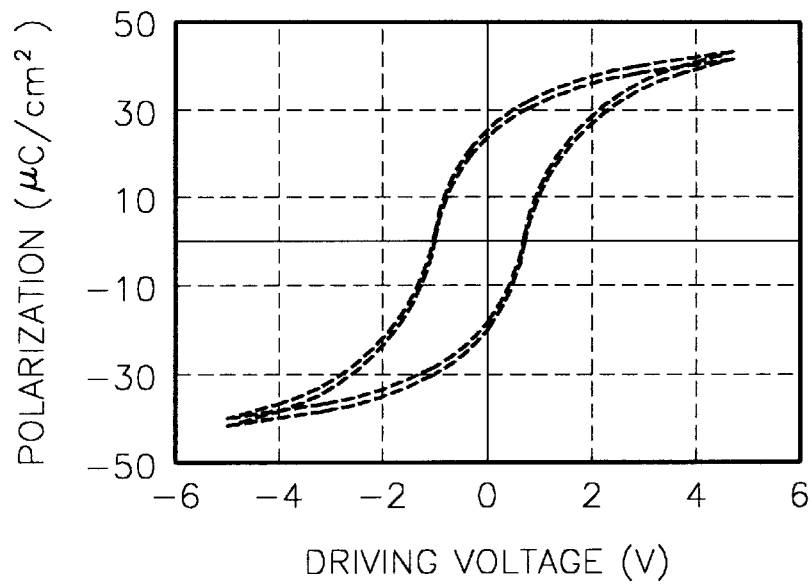
FIGS. 16A and 16B are graphs showing polarization characteristics measured after annealing.
Figure 16B:
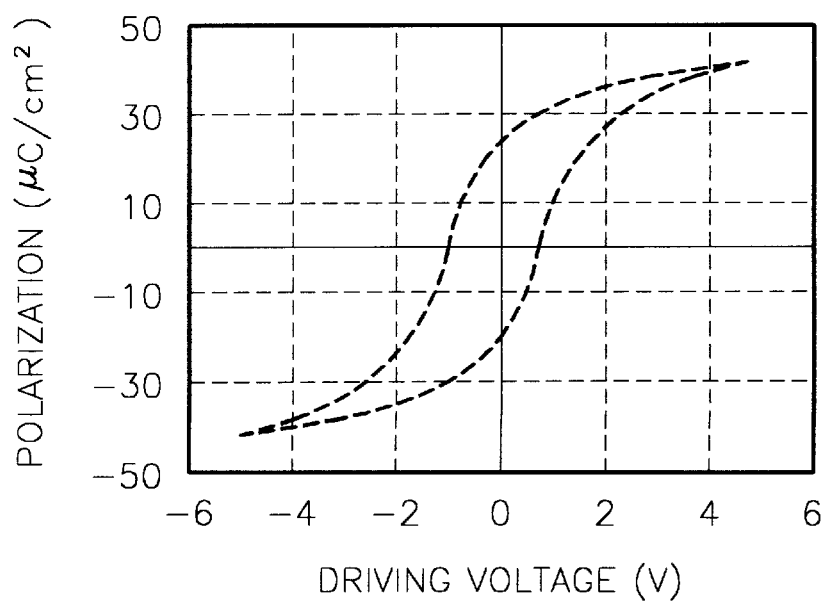

FIG. 16A shows the results when the thickness of the aluminum oxide layer was 100 Å, and FIG. 16B shows the results when the thickness of the aluminum oxide layer was 300 Å. The capacitor with the aluminum oxide layer of 100 Å had no polarization characteristics before annealing, as shown in FIG. 15C, however, after the aluminum oxide layer of 100 Å was annealed, the polarization characteristics were recovered, as shown by FIG. 16A. Also, when the thickness of the aluminum oxide layer was 300 Å, the polarization characteristics were completely recovered, as illustrated by FIG. 16B.

Remnant Polarization of Capacitor and Leakage Current After Annealing Aluminum Oxide Layer An aluminum oxide layer was formed and annealed under the deposition and annealing conditions as shown in Table 3, and then polarization and leakage current characteristics were measured. At this time, seven samples were prepared under each set of conditions.

TABLE 3

| EXAMPLE | THICKNESS OF ALUMINUM OXIDE LAYER (Å) | DEPOSITION TEMPERATURE (°C.) | PURGE TIME (SEC) | ANNEALING TEMPERATURE (°C.) | ANNEALING TIME (MIN) |
|---|---|---|---|---|---|
| 1 | 20 | 350 | 3.3 | 450 | 30 |
| 2 | 40 | 350 | 3.3 | 450 | 30 |
| 3 | 60 | 250 | 3.3 | 450 | 30 |
| 4 | 60 | 350 | 1.1 | 450 | 30 |
| 5 | 60 | 350 | 3.3 | 450 | 30 |
| 6 | 60 | 350 | 9.9 | 450 | 30 |
| 7 | 80 | 350 | 3.3 | 450 | 30 |

Figure 17:
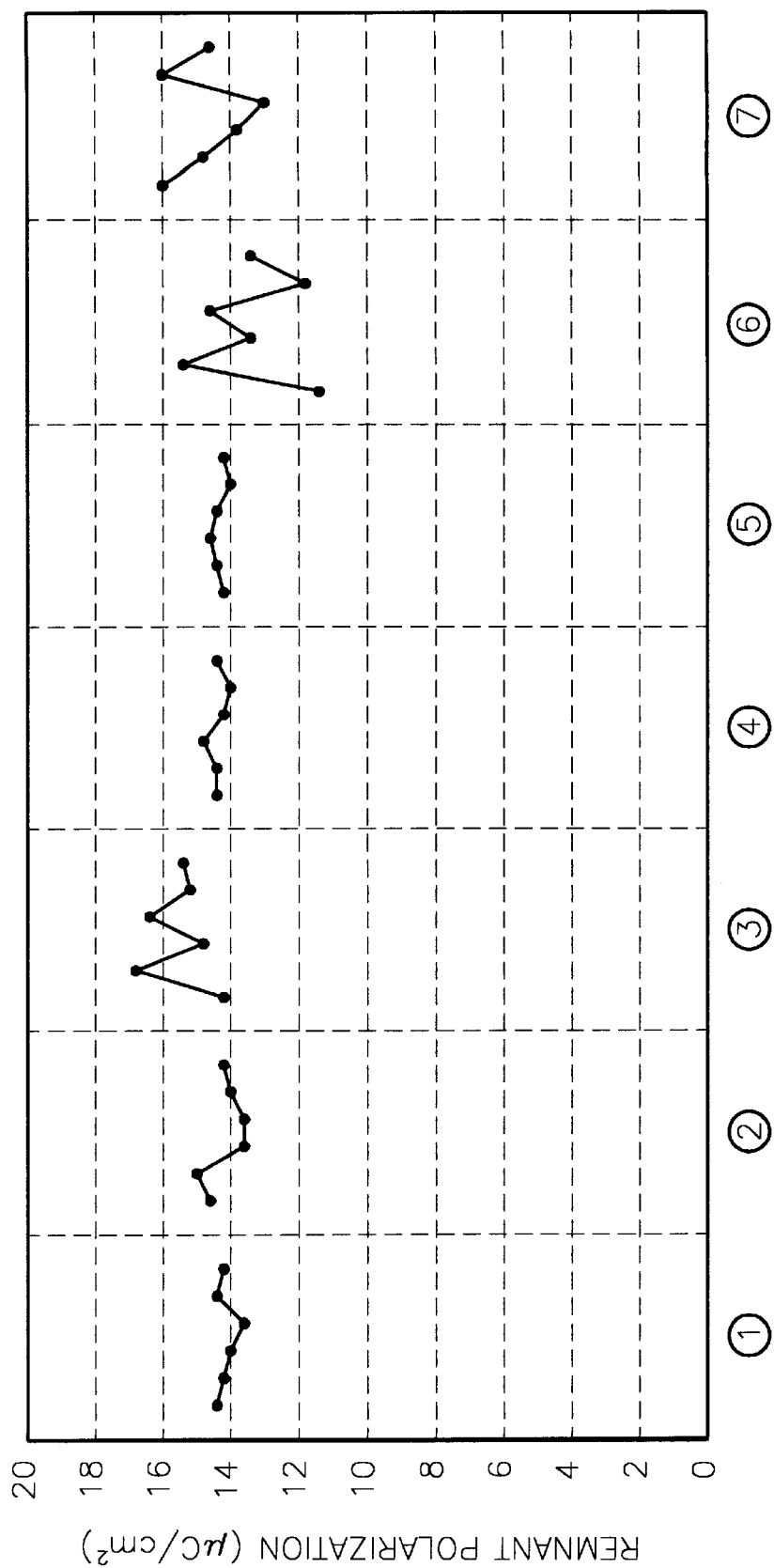
FIG. 17 is a graph showing remnant polarization according to conditions for forming an aluminum oxide layer.

The results of measuring remnant polarization, after the aluminum oxide layer was formed, are shown in FIG. 17. As shown in FIG. 17, after annealing, the remnant polarization of the samples under each set of conditions was substantially constant for most of the conditions. However, in the case where the deposition temperature of the aluminum was lowered to 250° C., as shown in sample 3, the remnant polarization of the sample was not constant because the aluminum oxide layer included many impurities. Also, in the case where the purge time was 9.9 sec, as shown in sample 6, the remnant polarization of the samples was not constant. Although not wishing to be bound by any theory, it appears that a long purge time enhances the likelihood of a chemical reaction between aluminum and PZT and changes in polarization characteristics. In the case where the thickness of the aluminum oxide layer was 80 Å, as shown in sample 7, the remnant polarization of the samples was not constant. However, as shown in FIGS. 16A and 16B, when the thickness of the aluminum oxide layer was 100 Å and 300 Å, respectively, the polarization characteristics were excellent, which suggests that the thickness of the aluminum oxide layer had little correlation with the consistency of the remnant polarization.

Figure 18:
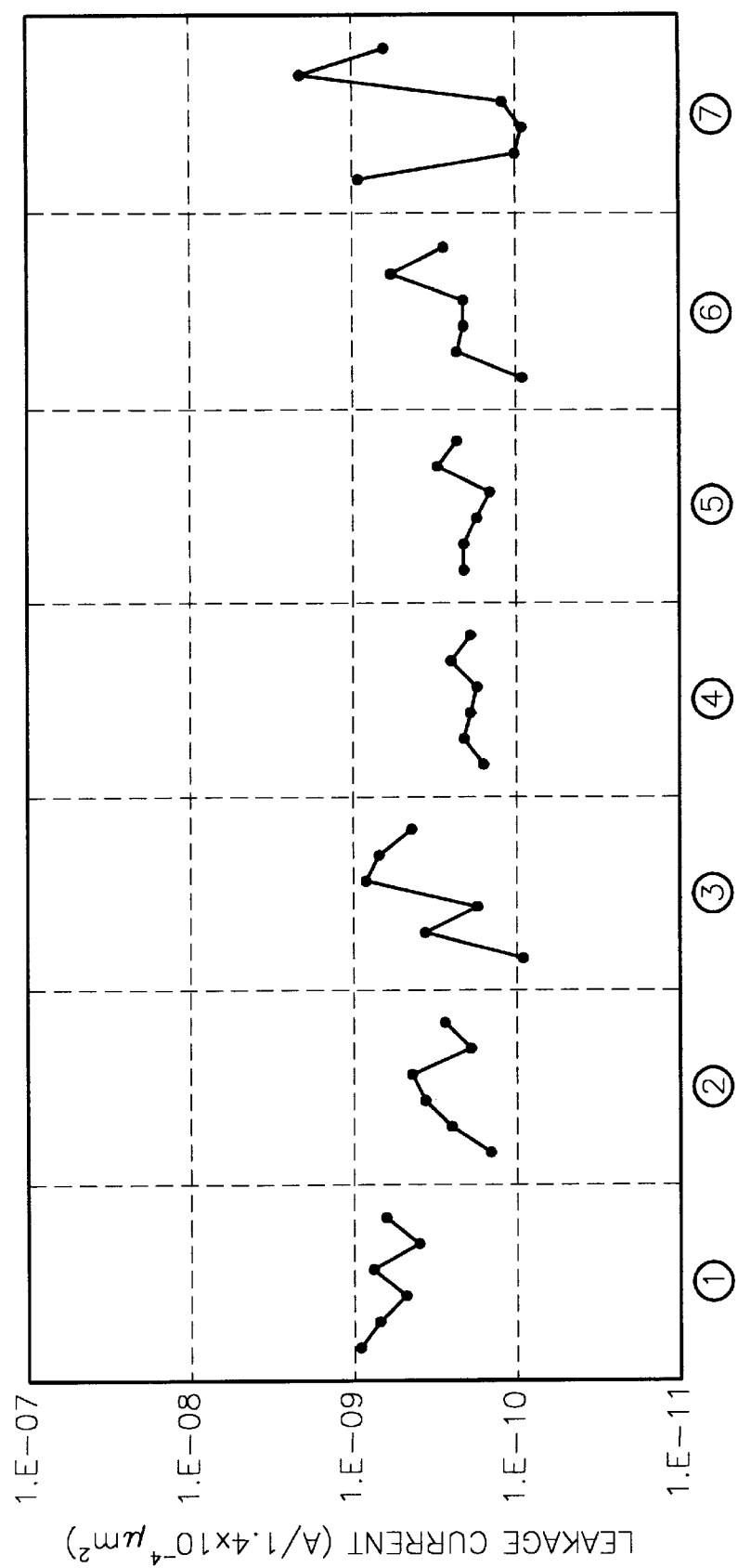
FIG. 18 is a graph showing leakage current according to conditions for forming an aluminum oxide layer.

The leakage current characteristics of each sample are shown in FIG. 18. FIG. 18 shows the leakage current density is $10^{-9} A/1.4 \times 10^{-4} \mu m^2$ or less after annealing the aluminum oxide layer under an oxygen atmosphere at 450° C. and for 30 min.

As a comparative example, a titanium oxide layer was deposited according to the conventional method disclosed in U.S. Pat. No. 5,212,620, and then annealed under 650° C., 550° C., and 450° C., respectively. The leakage current of each capacitor was then measured and the results are shown in Table 4.

TABLE 4

| COMPARATIVE EXAMPLE | ANNEALING TEMPERATURE (°C.) | LEAKAGE CURRENT (A/cm$^2$) |
|---|---|---|
| 1 | 650 | $1 \times 10^{-6}$ |
| 2 | 550 | $1 \times 10^{-5}$ |
| 3 | 450 | $1 \times 10^{-4}$ |

As shown by Table 4, when the titanium oxide layer according to the prior art is formed into a buffer layer, the leakage current increases to $10^{-6} A/cm^2$ even after a heat treatment step has been performed. Also, as the temperature of the heat treatment becomes lower, the leakage current increases. For example, in the third sample where the heat treatment step was carried out at 450° C., the leakage current was high at a level of $10^{-4} A/cm^2$. Thus, a conventional titanium oxide layer is inappropriate for a highly integrated circuit devices requiring low temperature treatment. In contrast, the aluminum oxide layer according to the present invention is appropriate for highly integrated circuit devices requiring low temperature treatment.

Remnant Polarization and Leakage Current Characteristics of Capacitors After Deposition of an Insulating Layer As a further example, for each of a number of samples, an aluminum oxide layer was deposited and annealed, and then a silicon oxide layer was formed on the entire surface of the resultant structure. The silicon oxide layer was deposited by an ECR-CVD method. The process conditions for forming these samples are shown in Table 5.

TABLE 5

| EXAMPLE | THICKNESS OF ALUMINUM OXIDE LAYER (Å) | DEPOSITION TEMPERATURE (° C.) | PURGE TIME (SEC) | ANNEALING TEMPERATURE (° C.) | ANNEALING TIME (MIN) | Temp. (° C.) | PRES. (mTorr) | THICKNESS (Å) | MICROWAVE POWER (W) |
|---|---|---|---|---|---|---|---|---|---|
| 1 | 40 | 350 | 3.3 | 450 | 30 | 200 | 10 | 4500 | 1100 |
| 2 | 60 | 250 | 3.3 | 450 | 30 | 200 | 10 | 4500 | 1100 |
| 3 | 60 | 350 | 1.1 | 450 | 30 | 200 | 10 | 4500 | 1100 |
| 4 | 60 | 350 | 3.3 | 450 | 30 | 200 | 10 | 4500 | 1100 |

Figure 19:
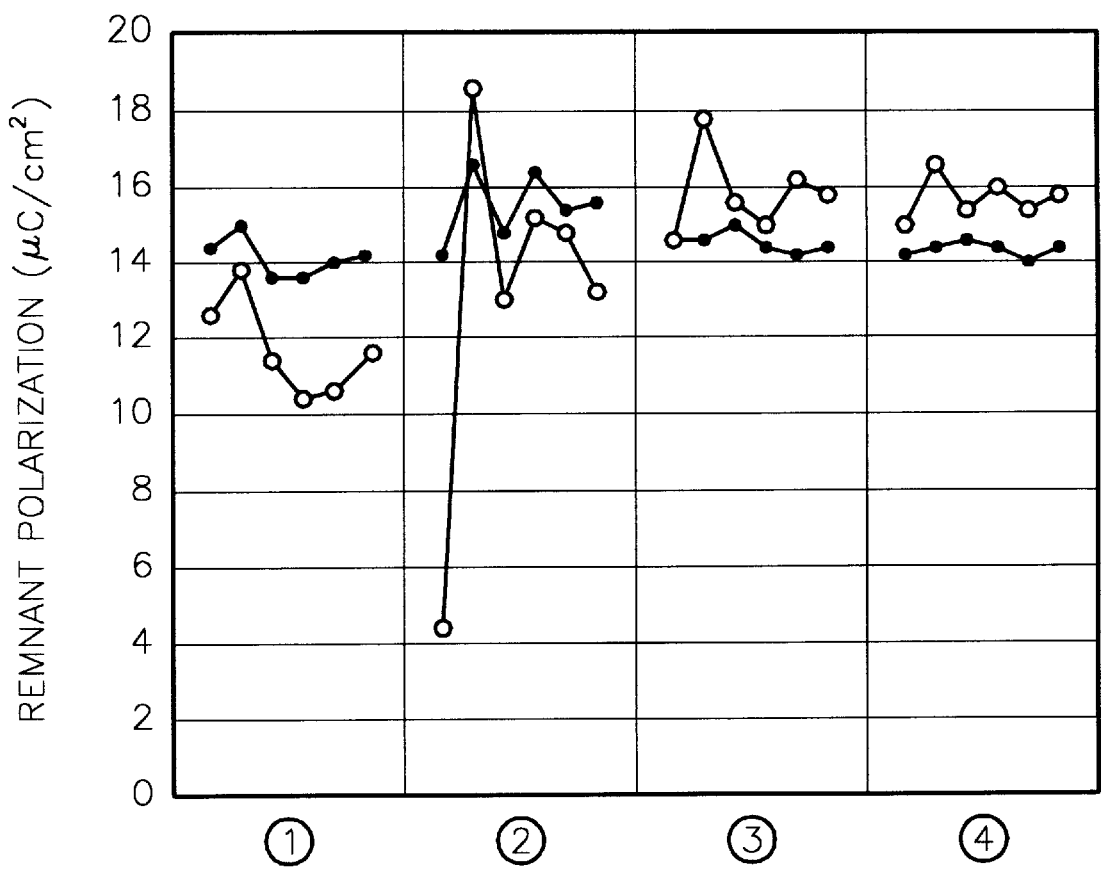
FIG. 19 is a graph showing remnant polarization measured after depositing a silicon dioxide layer.

The remnant polarization of each sample of Table 5 is shown in FIG. 19. The shaded points represent the remnant polarization measured before deposition of the silicon dioxide layer, and the unshaded points represent the same after deposition of the silicon oxide layer. According to FIG. 19, when the thickness of the aluminum oxide layer was 40 Å, the remnant polarization after deposition of the silicon dioxide layer was shown to be lower than before deposition. Also, when the thickness of the aluminum oxide layer was 60 Å at 250° C., the remnant polarization was shown to be nonuniform. However, when the thickness of the aluminum oxide layer was 60Å at 350° C., the remnant polarization after deposition of the silicon dioxide layer was enhanced, regardless of purge time.

Figure 20:
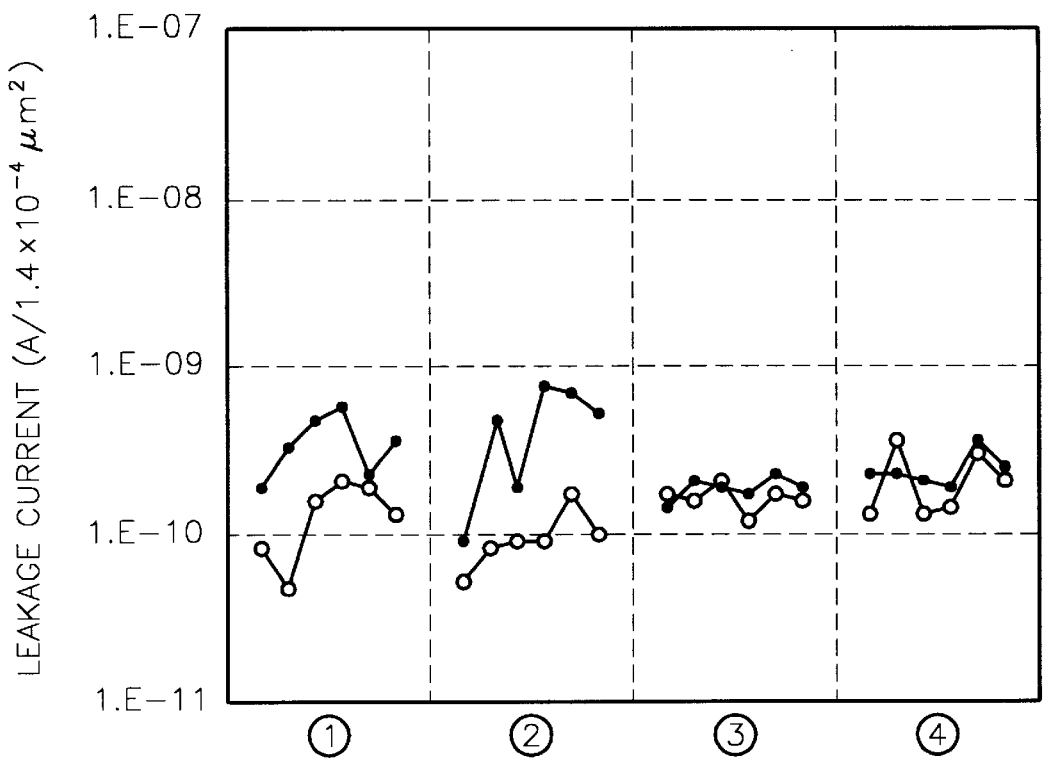
FIG. 20 is a graph showing leakage current measured after depositing a silicon dioxide layer.

The leakage current for each sample is shown in FIG. 20. The shaded points represent the leakage current measured before deposition of the silicon dioxide layer, and the unshaded points represent the leakage current after deposition of the silicon dioxide layer. FIG. 20 shows that when the leakage current was high before deposition of the silicon dioxide layer (samples 1 and 2) it could be lowered to below $10^{-10}$ A/$1.4 \times 10^{-4} \mu m^2$ after deposition.

Relationship Between Thickness of Aluminum Oxide Layer and Lifting

In order to check the relationship between the thickness of the aluminum oxide layer and the degree to which is may lift off the substrate, an aluminum oxide layer was formed under the conditions shown in Table 6. In Table 6, "O" represents "yes" and "X" represents "no". Here, when the thickness of the aluminum oxide layer was 20 Å or was equal to or more than 300 Å, lifting occurred regardless of whether a silicon dioxide layer was formed. When the thickness of the aluminum oxide layer was 100 Å, lifting did not occur after annealing, but did occur after forming the silicon dioxide layer. Accordingly, it was determined that an appropriate thickness of the aluminum oxide layer was 40~80 Å. However, when the thickness of the aluminum oxide layer was 60 Å, the deposition temperature was 250° C., and the purge time was 9.9 sec, lifting occurred. Accordingly, in order to avoid lifting, the thickness of the aluminum oxide layer should be 40~80 Å, the deposition temperature should be 300~400° C., and the purge time should be 9.9 seconds or less, and preferably 3.3 seconds or less.

TABLE 6

| EXAMPLE | THICKNESS OF ALUMINUM OXIDE LAYER (Å) | DEPOSITION TEMPERATURE (° C.) | PURGE TIME (S) | ANNEALING (450° C./ 30 MIN) | SILICON DIOXIDE LAYER (4500Å) | LIFTING |
|---|---|---|---|---|---|---|
| 1 | 20 | 350 | 3.3 | X | X | O |
| 2 | 40 | 350 | 3.3 | O | X | X |
| 3 | 40 | 350 | 3.3 | O | O | X |
| 4 | 60 | 250 | 3.3 | O | X | O |
| 5 | 60 | 250 | 3.3 | O | O | O |
| 6 | 60 | 350 | 1.1 | O | X | X |
| 7 | 60 | 350 | 1.1 | O | O | X |
| 8 | 60 | 350 | 3.3 | O | X | X |
| 9 | 60 | 350 | 3.3 | O | O | X |
| 10 | 60 | 350 | 9.9 | O | X | O |
| 11 | 60 | 350 | 9.9 | O | O | O |
| 12 | 80 | 350 | 3.3 | O | X | X |
| 13 | 80 | 350 | 3.3 | O | O | X |
| 14 | 100 | 350 | 3.3 | O | X | X |
| 15 | 100 | 350 | 3.3 | O | O | O |
| 16 | 300 | 350 | 3.3 | O | X | O |
| 17 | 500 | 350 | 3.3 | O | X | O |

Relationship Between NH$_3$ Plasma Process and Remnant Polarization

Figure 21:
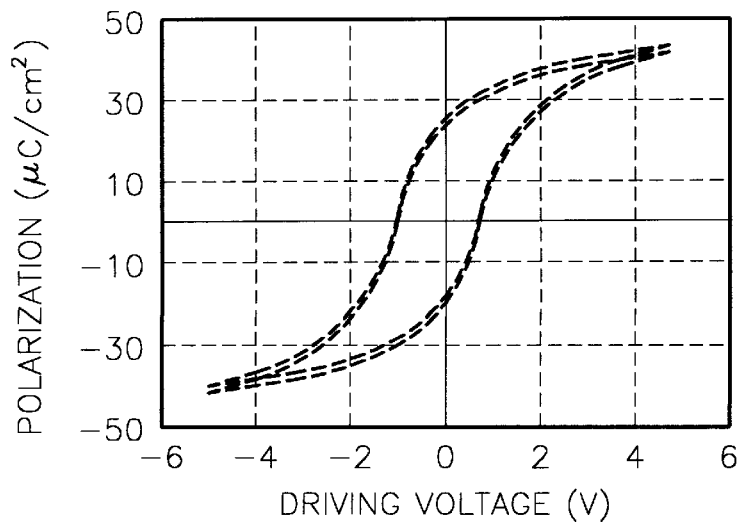
FIG. 21 is a graph showing polarization characteristics measured before and after an $NH_3$ plasma process.

In order to check whether an aluminum oxide layer is appropriate as a diffusion barrier layer when hydrogen is generated during subsequent process steps, aluminum oxide layers of 20 Å and 80 Å were formed, and then each aluminum oxide layer was NH$_3$ plasma processed. In the NH$_3$ plasma process, NH$_3$ gas was provided at 80 sccm under 10 mTorr and at microwave power of 1200 W. The polarization characteristics of each sample, measured before and after the NH$_3$ treatment, are shown in FIG. 21. In particular, FIG. 21 shows polarization characteristics when the thickness of the aluminum oxide layer was 80 Å. As illustrated, there was essentially no change from before NH$_3$ treatment to after the NH$_3$ treatment. However, when the thickness of the aluminum oxide layer was 20Å, the characteristics of the capacitors were not measured because the aluminum oxide layer lifted from the surface of the wafer.

The above results which illustrate the occurrence of lifting were measured under conditions in which the lower electrode was not patterned before being processed according to the conditions of Table 6. In contrast, when the lower electrode was patterned, lifting did not occur even in the case when the aluminum oxide layer was formed to a thickness of 100 Å. If the lower electrode is formed on the entire surface of the substrate, a lifting margin (which is influenced by stress) becomes small. However, in the event the lower electrode is patterned, the stress between the lower electrode and the substrate is reduced, and this reduction in stress leads to an increase in the lifting margin.

Figure 22:
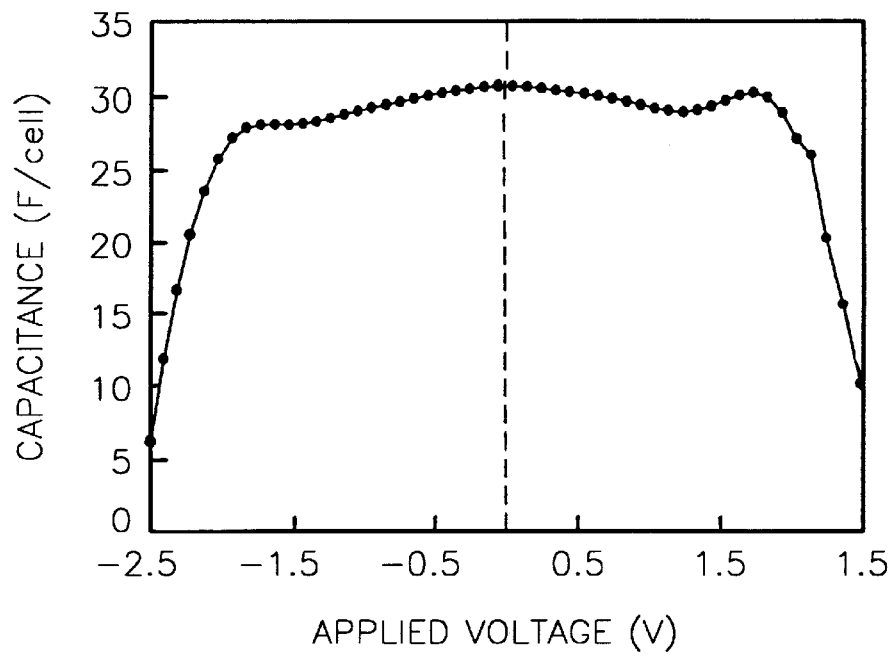
FIG. 22 is a graph showing capacitance of a BST capacitor measured after annealing an aluminum oxide layer.
Figure 23:
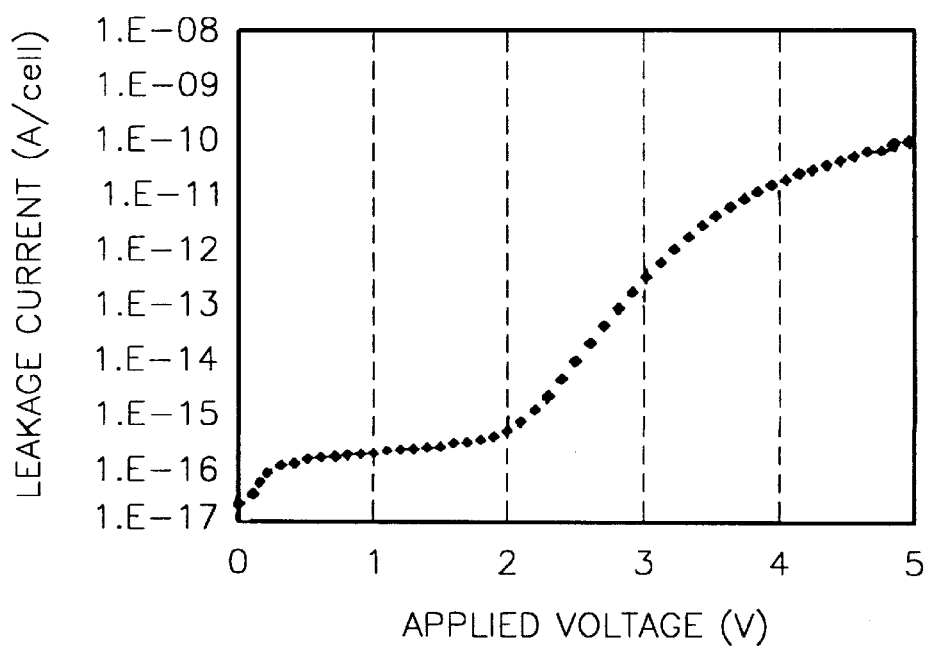
FIG. 23 is a graph showing leakage current of a BST capacitor measured after annealing an aluminum oxide layer.

Relationship Between Forming an Aluminum Oxide Layer and Characteristics of BST Capacitors The above described examples represent measurement results obtained from capacitors containing ferroelectric layers (PZT). In this example, however, a capacitor containing a paraelectric layer having a high dielectric constant (i.e., a BST layer) was formed. In addition, a TaSiN layer was formed as a barrier layer, and then a capacitor containing a BST layer was formed on the TaSiN layer. Next, an aluminum oxide layer of 100 Å was formed on the BST capacitor. After annealing the aluminum oxide layer under an oxygen atmosphere at 600° C., the capacitance and leakage current characteristics of the BST capacitor were measured. The measured results are shown in FIGS. 22 and 23. As shown in FIGS. 22 and 23, the capacitance of the BST capacitor was 30 fF/cell and the leakage current at 2 V was $5 \times 10^{-16}$ A/cell. Although not wishing to be bound by any theory, it is believed that the increase in capacitance is caused by an increase in the BST dielectric constant when the aluminum oxide layer is annealed. Oxidation of the TaSiN barrier layer during the annealing process also appeared to be prevented since the aluminum oxide layer acted as an oxygen diffusion barrier layer which prevented an increase in the contact resistance of the capacitor.

As described above, the buffer layer according to the present invention is preferably formed of a metal oxide layer stabilized by heat treatment at a low temperature of 600° C. or less. A process at a low temperature of 600° C. or less is required to allow high integration of an integrated circuit device. Therefore, the buffer layer is advantageous for high integration of the integrated circuit device. Also, even when the buffer layer is thin, it still functions effectively, and the buffer layer formed by the ALD method has excellent uniformity and step coverage. Therefore, when the buffer layer is used between a capacitor comprising the high dielectric layer (e.g., ferroelectric or paraelectric layer) and the insulating layer. The polarization characteristics of the capacitor are enhanced and the leakage current is reduced. When the buffer layer having good barrier layer characteristics is used as an insulating layer of an MFMIS, silicon atoms of the silicon substrate can also be effectively prevented from diffusing into an electrode of the capacitor.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit capacitor, comprising:
    a first capacitor electrode;
    a first high dielectric layer on said first capacitor electrode;
    a second capacitor electrode on said first high dielectric layer, opposite said first capacitor electrode;
    an electrically insulating layer on said first high dielectric layer; and
    an aluminum oxide buffer layer formed by atomic layer deposition and stabilized by heat treatment at a temperature in a range between about 350° C. and 600° C., extending between said first high dielectric layer and said electrically insulating layer.

2. The capacitor of claim 1, wherein said first high dielectric layer comprises a material selected from the group consisting of PZT, $BaTiO_3$, $PbTiO_3$, STO and BST.

3. The capacitor of claim 1, wherein said electrically insulating layer comprises a material selected from the group consisting of silicon dioxide, borophosphosilicate glass (BPSG) and phosphosilicate glass (PSG).

4. The capacitor of claim 1, further comprising:
    a substrate;
    an interlayer insulating layer on said substrate; and
    a metal layer disposed between said interlayer insulating layer and said first high dielectric layer.

5. The capacitor of claim 4, wherein said metal layer comprises a material selected from the group consisting of Pt, Ru, Ir, and Pd.

6. An integrated circuit capacitor, comprising:
    a first electrically insulating layer;
    a first metal layer pattern on said first electrically insulating layer;
    a first high dielectric layer on said first metal layer pattern, opposite said first electrically insulating layer;
    a second metal layer pattern on said first high dielectric layer, opposite said first metal layer pattern;
    an aluminum oxide buffer layer formed by atomic layer deposition and stabilized by heat treatment at a temperature in a range between about 350° C. and 600° C., on exposed surfaces of said first metal layer pattern, said first high dielectric layer and said second metal layer pattern; and
    a second electrically insulating layer on said buffer layer.

7. The capacitor of claim 6, wherein said aluminum oxide buffer layer has a thickness in a range between about 40 Å and 300 Å.

8. The capacitor of claim 6, further comprising a barrier layer between said first electrically insulating layer and said first metal layer pattern, said barrier layer comprising aluminum oxide.

9. The capacitor of claim 8, wherein said barrier layer also comprises a metal selected from the group consisting of TiN, TiSiN, TaN, TaSiN, TiAlN, TaAlN and $RuO_2$.

10. An integrated circuit capacitor, comprising:
    a semiconductor substrate;
    a first capacitor electrode on said semiconductor substrate and electrically connected thereto;
    a capacitor dielectric layer on said first capacitor electrode;
    a second capacitor electrode on said capacitor dielectric layer, opposite said first capacitor electrode;
    an aluminum oxide layer formed by atomic layer deposition on said second capacitor electrode, said aluminum oxide layer stabilized by heat treatment at a temperature in a range between about 350° C. and 600° C.; and
    a first conductive layer pattern formed on said aluminum oxide layer.

11. An integrated circuit capacitor, comprising:
    a semiconductor substrate;
    a first capacitor electrode on said semiconductor substrate and electrically connected thereto;
    a capacitor dielectric layer on said first capacitor electrode;
    a second capacitor electrode on said capacitor dielectric layer, opposite said first capacitor electrode;
    an aluminum oxide buffer layer formed by atomic layer deposition on said second capacitor electrode, said aluminum oxide buffer layer stabilized by heat treatment at a temperature in a range between about 350° C. and 600° C.; and
    a first conductive layer pattern formed on said aluminum oxide buffer layer.

12. The capacitor of claim 11, wherein said aluminum oxide buffer layer has a thickness in a range between about 10 and 250 Å.

13. The capacitor of 11, wherein said aluminum oxide buffer layer is formed by atomic layer deposition at a temperature in a range between about 250 and 450° C.

14. An integrated circuit capacitor, comprising:
a first electrically insulating layer;
a first metal layer pattern on said first electrically insulating layer;
a first high dielectric layer on exposed surfaces of said first metal layer pattern and on said first electrically insulating layer, said first high dielectric layer being patterned in cell block units;
a second metal layer on said first high dielectric layer, opposite said first metal layer pattern, said second metal layer being patterned in cell block units simultaneously with said first high dielectric layer;
an aluminum oxide buffer layer formed by atomic layer deposition and stabilized by heat treatment at a temperature in a range between about 350° C. and 600° C., on said second metal layer; and
a second electrically insulating layer on said buffer layer.

15. The capacitor of claim 14, further comprising:
a contact plug formed in said first electrically insulating layer; and
a barrier layer between said contact plug and said first metal layer pattern.

16. An integrated circuit capacitor, comprising:
lower and upper capacitor electrodes;
a capacitor dielectric layer extending between said lower and upper capacitor electrodes;
an aluminum oxide buffer layer on an upper surface of said upper capacitor electrode, said aluminum oxide buffer layer formed by atomic layer deposition and stabilized by heat treatment at a temperature in a range between about 350° C. and 600° C.

17. The capacitor of claim 16, wherein said aluminum oxide buffer layer is stabilized by heat treatment in an oxygen ambient.

* * * * *

UNITED STATES PATENT AND TRADEMARK OFFICE
CERTIFICATE OF CORRECTION

PATENT NO.    : 6,144,060
DATED         : Nvoember 7, 2000
INVENTOR(S)   : Park et al.

Page 1 of 1

It is certified that error appears in the above-identified patent and that said Letters Patent is hereby corrected as shown below:

Title page, item [56],
References Cited, Other Publications, "A Half-Micron Ferroelectric Memory Cell Technology with Stacked Capacitor Structure, "SHARP Corporation, IC-Group, VLSI Development Laboratories 2631-1, Ichinomoto-cho, Tenri-city, Nara 632, JAPAN, dated 1994

Column 14,
Line 41, please add "and" following "electrode;"
Lines 46-48, please delete the text beginning "; and" through "layer"
Line 57, please add "and" following "electrode;"
Lines 62-64, please delete the text beginning "; and" through "layer"

Signed and Sealed this

Twenty-third Day of October, 2001

Attest:

NICHOLAS P. GODICI
Attesting Officer          Acting Director of the United States Patent and Trademark Office